(12) United States Patent
Bar-David

(10) Patent No.: US 9,225,289 B2
(45) Date of Patent: Dec. 29, 2015

(54) METHOD AND APPARATUS FOR PARTIAL ENVELOPE TRACKING IN HANDHELD AND WIRELESS COMPUTING DEVICES

(71) Applicant: Paragon Communications Ltd., Kfar-Saba (IL)

(72) Inventor: Israel Bar-David, Haifa (IL)

(73) Assignee: Paragon Communications Ltd., Kfar-Saba (IL)

( * ) Notice: Subject to any disclaimer, the term of this patent is extended or adjusted under 35 U.S.C. 154(b) by 0 days.

(21) Appl. No.: 14/661,678

(22) Filed: Mar. 18, 2015

(65) Prior Publication Data

US 2015/0270807 A1 Sep. 24, 2015

Related U.S. Application Data

(60) Provisional application No. 61/969,199, filed on Mar. 23, 2014.

(51) Int. Cl.
*H03F 1/02* (2006.01)
*H03F 3/19* (2006.01)
(Continued)

(52) U.S. Cl.
CPC ............... *H03F 1/0205* (2013.01); *H03F 3/19* (2013.01); *H03F 3/21* (2013.01); *H04B 1/40* (2013.01); *H03F 2200/102* (2013.01); *H03F 2200/135* (2013.01); *H03F 2200/451* (2013.01)

(58) Field of Classification Search
CPC ............ H04B 1/00; H04B 1/40; H01B 12/06; H03F 1/0205; H03F 1/10; H03F 3/19; H03F 3/21; H03F 2200/102; H03F 2200/135; H03F 2200/451

USPC ............. 455/571, 572, 574, 91, 115.1, 127.1, 455/127.3, 127.4, 226.1; 330/127, 129, 330/297, 298
See application file for complete search history.

(56) References Cited

U.S. PATENT DOCUMENTS

| 6,437,641 B1 | 8/2002 | Bar-David |
| 6,492,867 B2 | 12/2002 | Bar-David |

(Continued)

FOREIGN PATENT DOCUMENTS

| EP | 1986331 B1 | 5/2013 |
| WO | 2012104038 A1 | 8/2012 |

(Continued)

OTHER PUBLICATIONS

Kim B. et al. "Push the Envelope: Design Concepts for Envelope-Tracking Power Amplifiers", IEEE Microwave Magazine, pp. 68-81, Apr. 2013.

(Continued)

*Primary Examiner* — Thanh Le
(74) *Attorney, Agent, or Firm* — M&B IP Analysts, LLC

(57) ABSTRACT

A partial envelope tracking (PET) circuit for improving the dynamic range and the efficiency of a power amplifier amplifying high bandwidth signals is provided. The PET circuit includes a main supply path having a main valve (MV) connecting the power amplifier to a first power source; a storage capacitor connecting a junction node and the power amplifier; a supplementary supply path including a DV and a TV, each of the DV and the tracking valve connecting, in parallel between a second power source and the junction node; a supplementary current path including a GV connecting the junction node and a ground; and a valves control unit (VCU) configured to monitor an envelope tracking parameter to determine an operation mode of the circuit and a state of each of the MV, the GV, the DV, and the TV during each respective mode of operation.

30 Claims, 5 Drawing Sheets

(51) Int. Cl.
*H03F 3/21* (2006.01)
*H04B 1/40* (2015.01)

(56) References Cited

U.S. PATENT DOCUMENTS

| | | | |
|---|---|---|---|
| 6,831,519 B2 | 12/2004 | Bar-David et al. | |
| 7,710,203 B2 | 5/2010 | Bar-David et al. | |
| 8,670,731 B2 | 3/2014 | Kunihiro | |
| 2009/0267688 A1 | 10/2009 | Hoyerby et al. | |
| 2012/0244916 A1* | 9/2012 | Brown et al. | 455/571 |
| 2013/0141169 A1 | 6/2013 | Khlat et al. | |
| 2013/0194979 A1 | 8/2013 | Levesque | |
| 2014/0062590 A1* | 3/2014 | Khlat et al. | 330/127 |
| 2014/0099906 A1 | 4/2014 | Khlat | |
| 2014/0203868 A1 | 7/2014 | Khlat et al. | |
| 2014/0225674 A1 | 8/2014 | Folkmann et al. | |
| 2014/0306769 A1 | 10/2014 | Khlat et al. | |
| 2014/0312710 A1* | 10/2014 | Li | 307/112 |
| 2014/0315504 A1* | 10/2014 | Sakai et al. | 455/127.2 |
| 2015/0188432 A1* | 7/2015 | Vannorsdel et al. | H02M 3/158 |

FOREIGN PATENT DOCUMENTS

| | | |
|---|---|---|
| WO | 2012151594 A2 | 11/2012 |
| WO | 2014116933 A2 | 7/2014 |

OTHER PUBLICATIONS

The International Search Report and the Written Opinion of the International Searching Authority for PCT/US2015/021909, ISA/RU, Moscow, Russia, Date of Mailing Jul. 9, 2015.

* cited by examiner

METHOD AND APPARATUS FOR PARTIAL ENVELOPE TRACKING IN HANDHELD AND WIRELESS COMPUTING DEVICES

CROSS REFERENCE TO RELATED APPLICATIONS

This application claims the benefit of U.S. provisional application No. 61/969,199 filed on Mar. 23, 2014, the contents of which are herein incorporated by reference.

TECHNICAL FIELD

This disclosure relates to the field of power amplifiers, and more particularly to techniques for efficient partial envelope tracking in handheld and wireless computing devices.

BACKGROUND

Envelope tracking (ET) is a known technique for improving the efficiency of power amplifiers. In a conventional implementation of an envelope tracking technique, a voltage signal at the drain input of a radio frequency (RF) power amplifier (PA) is varied to be proportional to the envelope of a RF signal. Tracking is performed in order to match the dynamic range of the supply voltage of the power amplifier to the instantaneous requirements of the RF signal envelope.

A subclass of the ET technique is the partial envelope tracking (PET). A conventional PET circuit replaces the tracking below a certain envelope voltage level, by providing a constant voltage of the power supply to the drain input of the RF PA. A conventional PET circuit also tracks the envelope peaks above that voltage level. One of the advantages of a PET technique is low power consumption and, specifically, low power consumption of a power supply when tracking signals with strongly varying envelopes. Examples for such signals include long-term evolution (LTE) signals, wireless local area network (WLAN) signals, and the like.

Different implementations for PET circuits are discussed in "Push the Envelope" to Kim, et al. (hereinafter "Kim") published in IEEE Microwave Magazine, May 2013, which is incorporated herein by reference merely for the useful understanding of the background. The PET circuits discussed in Kim are complex and designed to operate mainly in base stations of cellular networks. Such PET circuits are designed to handle signals with strong envelope fluctuations in base station amplifiers with multicarrier systems. Further, in base stations, power amplifiers are assembled as stand-alone units and, therefore, components' size is typically not of major importance. Therefore, PET circuits, such as those discussed in Kim, are large in size and cannot be readily integrated in handheld devices.

Other implementations of PET circuits, discussed in the related art, are based on maintaining the Direct Current (DC) component of a power amplifier's current in the same path both during non-tracking as well as during envelope tracking intervals. Such circuits are based on chokes and transformers in the video coupling circuits, which maintain the DC component of the power amplifier's current.

Modern wireless communication systems are characterized by transmissions of RF signals with rapidly varying envelopes. The RF signals are characterized by high peak to average power ratio (PAPR). The use of PET circuits to provide mitigation for the varying envelopes and to improve the efficiency of an RF power amplifier (PA) is therefore required in such systems, and in particular wireless handheld devices.

The power consumption of a battery used to supply the required power to the RF PA in such devices and the amount of heat dissipated due to the relatively low efficiency of the RF PA operating in the high PAPR regime, are major concerns, and as such drive the need for PET circuits.

The PET circuits discussed in the related art cannot be efficiently utilized in wireless handheld devices. Specifically, as noted above, the conventional PET circuits are large in size and primarily designed to support power amplifiers that are stand-alone modules. Further, standard implementations of PET circuits include inductors (or chokes). All of these properties do not meet the requirements of wireless handheld devices. Specifically, PET circuits in such wireless handheld devices should typically be implemented as integrated circuits (ICs), which must be small in size and must contain a minimal amount of external components and avoid the use of large components such as inductors. In addition, in handheld devices, power amplifiers are not necessarily stand-alone components, as a baseband signal generated by a baseband module is in the immediate vicinity of the amplifier.

Another major drawback of conventional PET circuits is that these circuits cannot efficiently handle high bandwidth signals. High bandwidth signals tend to fluctuate frequently with large slopes. Therefore, it is difficult to accurately track rapid changes in the envelopes of conventional PETs and to adjust the bias voltage of any PAs contained therein accordingly.

The conventional PETs operate via one path for handling both modes of operation: a normal mode and a tracking mode. The rapid changes in the signal's envelope require rapid switching between these modes. This rapid switching causes spurious effects in the spectrum and degrades the efficiency of the PET circuit.

It would therefore be advantageous to provide a PET solution that would overcome the deficiencies noted above and be efficiently implemented in wireless handheld devices.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all aspects nor delineate the scope of any or all embodiments. Its sole purpose is to present some concepts of one or more embodiments in a simplified form as a prelude to the more detailed description that is presented later. For convenience, the term some embodiments may be used herein to refer to a single embodiment or multiple embodiments of the disclosure.

Certain embodiments disclosed herein include a partial envelope tracking (PET) circuit for improving the dynamic range and the efficiency of a power amplifier amplifying high bandwidth signals. The PET circuit includes a main supply path having a main valve (MV) connecting the power amplifier to a first power source; a storage capacitor connecting a junction node and the power amplifier; a supplementary supply path including a diversion valve (DV) and a tracking valve (TV), each of the diversion valve and the tracking valve connecting, in parallel between a second power source and the junction node; a supplementary current path including a grounding valve (GV) connecting the junction node and a ground; and a valves control unit (VCU) configured to monitor an envelope tracking parameter to determine an operation mode of the circuit and a state of each of the main valve, the grounding valve, the diversion valve, and the tracking valve during each respective mode of operation, wherein the operation mode is any one of: a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through the diversion valve and the storage capacitor, thereby enabling smooth transitions between the normal mode and the tracking mode.

Certain embodiments disclosed herein also include partial envelope tracking (PET) circuit for improving the dynamic range and the efficiency of a power amplifier amplifying high bandwidth signals. The PET circuit includes a main supply path having a main valve (MV) connecting the power amplifier to a power source; a storage capacitor connecting a junction node and the power amplifier; a supplementary supply path including a diversion valve (DV) and a tracking valve (TV), each of the diversion valve and the tracking valve connecting, in parallel, between the power source and the junction node; a supplementary current path including a grounding valve (GV) connecting the junction node and a ground; and a valves control unit (VCU) configured to monitor an envelope tracking parameter to determine an operation mode of the circuit and a state of each of the main valve, the grounding valve, the diversion valve, and tracking valve during each respective mode of operation, wherein the mode of operation is any one of: a tracking mode and a normal mode, wherein during the normal mode the storage capacitor is charged at the voltage level provided by the power source and during the tracking mode the storage capacitor is discharged, when the PET circuit switches from the normal mode to the tracking mode, a source of a drain current to the power amplifier transitions from the power source to a current path through the diversion valve and the storage capacitor, thereby enabling smooth transitions between the normal mode and the tracking mode.

Certain embodiments disclosed herein also include a wireless computing device that comprises a radio frequency transmitter configured to transmit high bandwidth signals, wherein the radio frequency transmitter includes at least a power amplifier; a partial envelope tracking (PET) circuit configured to improve the dynamic range and the efficiency of the power amplifier, including: a main supply path having a main valve connecting the power amplifier to a first power source; a storage capacitor connecting a junction node and the power amplifier; a supplementary supply path including a diversion valve (DV) and a tracking valve (TV), each of the diversion valve and the tracking valve connecting in parallel between a second power source and the junction node; a current path including a grounding valve (GV) connecting the junction node and a ground; and a valves control unit (VCU) configured to monitor an envelope tracking parameter to determine an operation mode of the circuit and a state of each of the main valve, the grounding valve, the diversion valve, and the tracking valve during each respective mode of operation, wherein the operation mode is any one of a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through diversion valve and the storage capacitor, thereby enabling smooth transitions between the normal mode and the tracking mode.

Certain embodiments disclosed herein also include a method for improving the dynamic range and the efficiency of a power amplifier amplifying high bandwidth signals. The method comprises providing a main supply path by coupling the power amplifier to a first power source through a main valve (MV); providing a storage capacitor by coupling between a junction node and the power amplifier; providing a supplementary supply path including a diversion valve (DV) and a tracking valve (TV) connected in parallel between a second power source and to the junction node; providing a current path including a grounding valve (GV) by coupling between the junction node and a ground; and monitoring an envelope tracking parameter to determine an operation mode of the circuit and a state of each of the main valve, the grounding valve, the diversion valve, and the tracking valve during each respective mode of operation, wherein the operation mode is any one of a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through the diversion valve and the storage capacitor, thereby enabling smooth transitions between the normal mode and the tracking mode.

BRIEF DESCRIPTION OF THE DRAWINGS

The subject matter disclosed herein is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION

Figure 1:
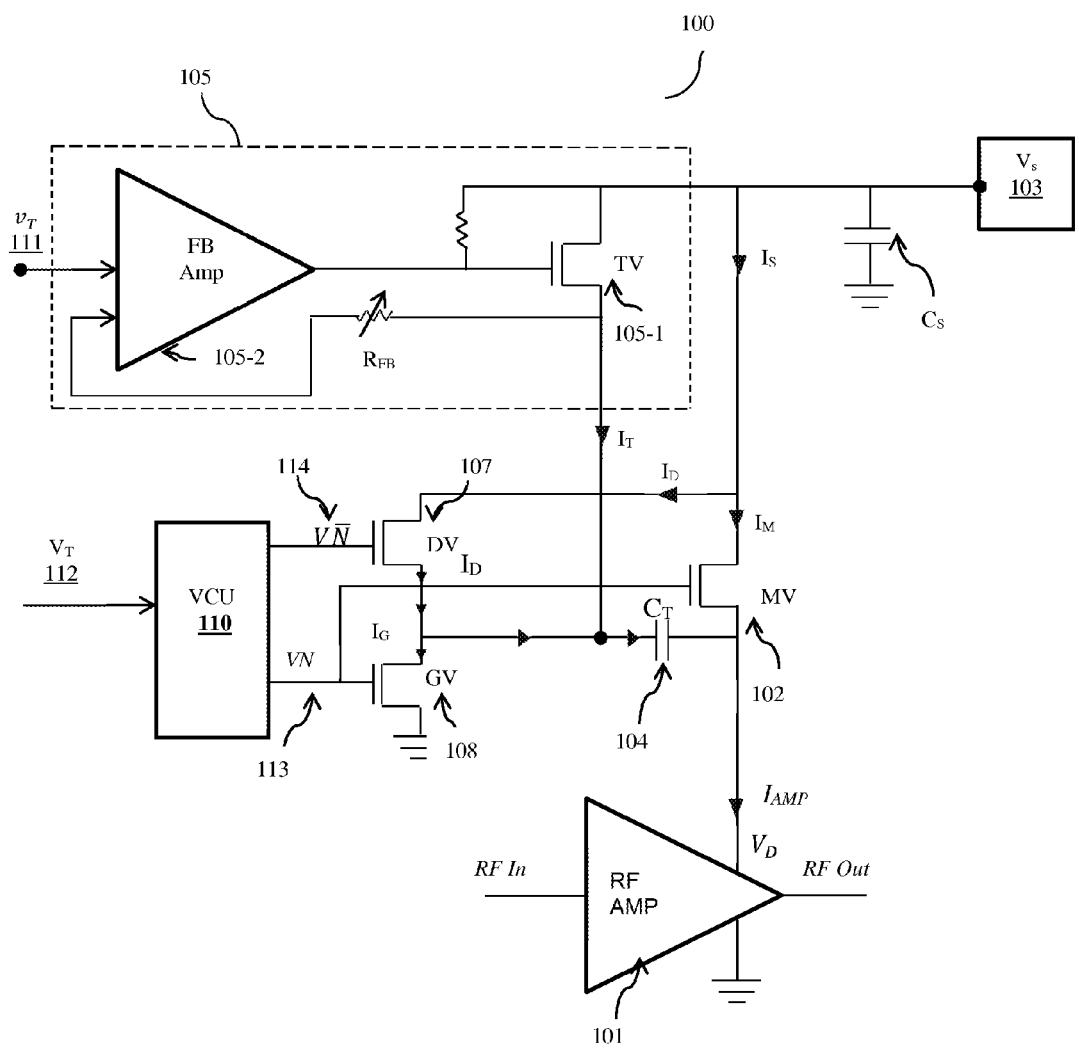
FIG. 1 is a block diagram of a PET circuit designed according to one embodiment.

It is important to note that the embodiments disclosed herein are only examples of the many advantageous uses of the innovative techniques herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

FIG. 1 is an exemplary and non-limiting block diagram of a partial envelope tracking (PET) circuit 100 designed according to one embodiment. The PET circuit 100 can be integrated in any wireless handheld device including, but not limited to, a smartphone, a tablet computer, a laptop computer, a notebook computer, a wearable computing device, and the like. The wireless handheld device receives and transmits radio frequency (RF) modulated signals, for example, by means of a RF receiver/transmitter. Such signals can be, but are not limited to, single carrier modulated signals, multi-carrier modulated signals, signals from the Orthogonal Frequency-Division Multiplexing (OFDM) or Orthogonal Frequency Division Multiple-Access (OFDMA) families, and the like. The PET circuit 100 can process signals of wireless communication protocols including, but not limited to, 3G, LTE, LTE Advanced, IEEE 802.11 ac, IEEE 802.11 ax, and so on.

The PET circuit 100 includes a main valve (MV) 102 connected to a power amplifier (RF AMP) 101 and a power source 103 that outputs a voltage signal (Vs) filtered by a capacitor (Cs). It should be noted that the power source 103 is typically the power source of the device in which the PET circuit 100 operates. The envelope tracking function is realized by a tracking unit 105 that includes at least a tracking valve (TV) 105-1 connected to a feedback resistor ($R_{FB}$) and a linear feedback amplifier (FB AMP 105-2). In an embodiment, the power amplifier 101 is implemented in an RF module of the wireless handheld device.

The PET circuit 100 also includes a diversion valve (DV) 107 which is connected in series to a grounding valve (GV) 108. The operation of the MV 102, the DV 107, and the GV 108 is controlled by a valves control unit (VCU) 110 that allows for partial envelope tracking according to the disclosed embodiments. In one implementation, the MV 102, the DV 107, and the GV 108 are field-effect transistors (FETs) and the FET-types of the DV 107 and MV 102 are opposite to that of the GV 108.

In an embodiment, the VCU 110 operates in two different modes: normal and tracking. As will be described in more detail below, the normal mode is active when the envelope of a transmitted RF signal is below a predefined voltage threshold (hereinafter the Current Diversion threshold or "CD-threshold"). The threshold is the level at which the current diversion operation is activated, as when the envelope of the signal is crossing this threshold level, the current path supplied to RF AMP 101 is diverted from the path during normal mode as will be explained hereafter. The CD-threshold can be either fixed during a transmission session, or may vary during a transmission session according to the average power level of the transmitted signal during the session. The tracking mode is active when the envelope of the transmitted signal is above the CD-threshold. In this mode, the voltage signal provided to the power amplifier is continuously adapted according to the changes of the envelope of the transmitted signal in order to match the required dynamic range of the power amplifier.

The design and the topology of the various valves in the PET circuit 100 enable smooth transitions between normal and tracking modes. Smooth transitions are of high importance for ensuring and maintaining spectral purity in wireless communication systems that transmit and receive signals with very high bandwidth for information transmission. In an exemplary embodiment, a "very high bandwidth" is higher than 50 Mbps.

The VCU 110 is configured to evaluate a tracking control parameter $V_T$ 112 which is based on an envelope tracking parameter $v_T$ 111. The $V_T$ 112 and $V_T$ 111 parameters are derived from a baseband (BB) signal source as described in detail herein below with respect to FIG. 3. In an embodiment, the parameter $v_T$ 111 is an analog voltage equal to the excess of the signal envelope (e) over the CD-threshold. That is, the parameter $v_T$ 111 is determined as follows:

$v_T$=e−CD-threshold; when e≥CD-threshold
$v_T$=0; when e<CD-threshold

The tracking control parameter $V_T$ 112 is a binary value determined as follows:
$V_T$="0" when $v_T$=0; and
$V_T$="1" when $v_T$>0

As illustrated in FIG. 1, the control parameter $V_T$ 112 is input to the VCU 110, which activates one of the modes respective thereof. The mode of the VCU 110 also determines the states of the MV 102, the DV 107, and the GV 108 during the normal and tracking modes.

Specifically, the VCU 110 is configured to output the binary diversion control signals (e.g., pulses) VN 113 and V$\overline{\text{N}}$ 114 respective of the mode. In the normal mode of operation, the $V_T$ parameter equals "0" and the VN 113 is 'on' (e.g., VN is set to a logic value "1", a high voltage level, and so on) and V$\overline{\text{N}}$ 114 is 'off' (e.g., V$\overline{\text{N}}$ is set to a logic value of "0", a low voltage level, and so on). As a result, the MV 102 and the GV 108 both fully conduct and the DV 107 is blocked during the normal mode of operation. In the tracking mode of operation, the $V_T$ parameter equals "1", and the control voltages for VN 113 and V$\overline{\text{N}}$ 114 are 'off' and 'on,' respectively. As a result, both the MV 102 and the GV 108 are blocked and the DV 107 conducts during the tracking mode of operation.

In an embodiment, the DV 107 is biased such that, when the DV 107 conducts, the DV 107 supplies current $I_D$ that is approximately equal to a nominal current $I_S$. The nominal current $I_S$ is supplied by the power source 103 through the MV 102 to the drain input of power amplifier 101. The nominal current $I_S$ is required by the power amplifier 101 immediately before the transition to the tracking mode occurs. In the normal mode of operation, a drain voltage ($V_D$) of the power amplifier 101 equals the voltage signal ($V_S$) supplied by the power source 103.

It should be noted that, when VN 113 is 'on' and the MV 102 and GV 108 are fully conducting, both current signals $I_D$ and $I_T$ are zero. In addition, at this state, the DV 107 is blocked and a storage capacitor $C_T$ 104 is kept charged at the voltage level $V_S$ provided by the power source 103.

When switching to the tracking mode, V$\overline{\text{N}}$ 114 is set to 'on' and VN is set to 'off'. As a result, the MV 102 is blocked such that the current signal $I_M$=0 and the current signal $I_D$ replaces the current signal $I_M$. As a result, the drain current to the power amplifier 101 is maintained at its nominal value $I_S$.

It should be noted that, during the tracking mode, the sum of the current signal $I_D$ and the current signal $I_T$ through $C_T$ 104 slightly discharges the storage capacitor $C_T$ 104. It should be further noted that charging and discharging of the storage capacitor $C_T$ 104 fluctuates the drain voltage $V_D$ of the power amplifier 101. However, since the storage capacitor $C_T$ 104 is large, (e.g., several microfarads), these fluctuations are negligible.

In an embodiment, the analog voltage of the parameter $v_T$ 111 activates the TV 105-1, which generates the tracking current signal $I_T$ proportional to the voltage level of the parameter $v_T$ 111. The current signal $I_T$ is supplemented to the current $I_D$ such that it increases the PA drain voltage $V_D$ to be proportional to the excess of the analog voltage $v_T$ 111.

The VCU 110 may be implemented in hardware, software, firmware or any combination thereof. In some exemplary implementations, the VCU 110 can be realized using any combination of integrated circuit (IC) implementation, general-purpose microprocessors, multi-core processors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

In an embodiment, the functionality of the VCU 110 can be implemented in an integrated circuit (IC) of a RF module of a wireless and/or handheld computing device. The other components are passive electrical components that are relatively small in size, easy to implement, and inexpensive. Thus, the disclosed PET circuit 100 can be advantageously implemented in handheld devices.

Figure 2:
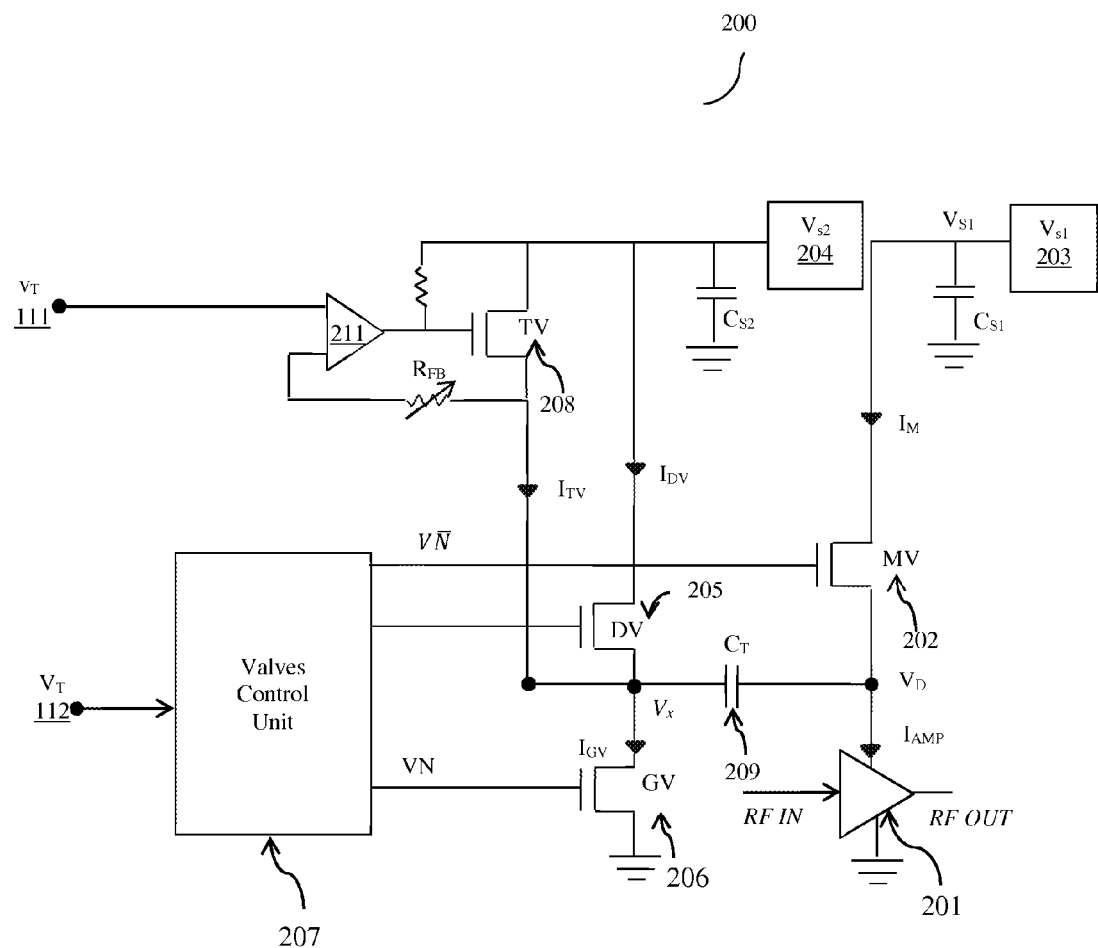
FIG. 2 is a block diagram of a PET circuit designed according to another embodiment.

FIG. 2 shows a block diagram of a partial envelope tracking (PET) circuit 200 designed according to another embodiment. The PET circuit 200 can be integrated in any wireless handheld device including, but not limited to, a smartphone, a tablet computer, a laptop computer, a notebook computer, a wearable computing device, and the like.

In this embodiment, the PET circuit 200 operates using two different power sources. The PET circuit 200 includes a main valve (MV) 202 connected to a power amplifier 201 and a first power source 203 that outputs a first voltage signal ($V_{S1}$) filtered by a capacitor ($C_{S1}$). The PET circuit 200 also includes a second power source 204 that outputs a second voltage signal ($V_{S2}$) filtered by a capacitor ($C_{S2}$). It should be noted that the power sources 203 and 204 are independent of each other, and may be power sources of the device that the PET circuit 200 is installed in. In an embodiment, the power amplifier 201 is part of an RF module.

Also connected to the power supply ($V_{S2}$) 204 is a diversion valve (DV) 205 which is connected in series to a grounding valve (GV) 206. Also, similar to the PET circuit 100, the MV 202, the DV 205, and the GV 206 are controlled by a Valves Control Unit (VCU) 207. The tracking operation is performed by a tracking valve (TV) 208 and a feedback amplifier 211. In an embodiment, the voltage signal $V_{S2}$ can be either greater or smaller than the voltage signal $V_{S1}$. In another embodiment, the voltage levels of $V_{S2}$ and $V_{S1}$ are based on the specific application and the requirements of the PET circuit 200.

The operation of the PET circuit 200 is based on two modes: normal and tracking. The switching to the respective mode is performed with respect to a crossing of a voltage level threshold (the "CD-threshold") by the instantaneous envelope 'e' of the transmitted signal, as discussed above.

In the normal mode, the signals VN and $\overline{VN}$ output by the VCU 207 are respectively high and low, the MV 202 conducts, and the GV 206 is biased to full conduction. Also, the DV 205 and TV 208 are biased to cut-off. In this case, the drain voltage $V_{DS}$ of the power amplifier 201 equals a voltage signal ($V_{S1}$) output by the first power source 203 less the voltage drops across the MV 202. The voltage drops across the MV 202 is a function of the resistance of the MV 202 and the current $I_M$ flowing through the MV 202. The current $I_M$ is equated as:

$$I_M = I_A + I_{GV}$$

where $I_A$ is the current at the power amplifier's drain input, and $I_{GV}$ is the current through the GV 206. As the value of the resistance of the MV 202 is low, the voltage drop across the MV 202 is negligible relative to the output of the first power source.

In the tracking mode, the signals VN and $\overline{VN}$ output by the VCU 207 are low and high, respectively. As a result, the MV 202 and GV 206 are blocked. Further, the current $I_M$ is zero and the drain current ($I_A$) to the power amplifier 201 is supplied via the storage capacitor $C_T$ 209 by the current through DV 205 and the current through TV 208.

Since the storage capacitor $C_T$ 209 is charged during the normal mode to a voltage level ($V_{S1}$) provided by the first power source 203, a temporary voltage supply which is the sum of $V_{S1}$ and $V_{S2}$ is available to provide the supply of the current $I_A$ to the drain input of power amplifier 201 during tracking mode.

Therefore, when the PET circuit 200 switches from a normal mode to a tracking mode, the power amplifier's current drain transitions from a current supplied by the MV 202 to a current supplied by $C_T$ 209 and the current through the DV 205. This transition occurs during the immediate transition between normal and tracking mode and remains for the duration of the entire tracking mode. As a result, the switching is performed without any harmful transients to the power amplifier 201 and/or to the transmitted signal.

During the tracking mode, the sum of the current signal $I_D$ plus the current signal $I_T$ through the capacitor $C_T$ 209, slightly discharges the capacitor $C_T$ 209. The storage capacitor $C_T$ 209 is recharged again to a voltage level $V_{S1}$ during the normal mode. The capacitance value of the capacitor $C_T$ 209 is selected to be sufficiently large (e.g., several microfarads) such that the corresponding voltage fluctuations are negligible as compared to $V_{S1}$.

As discussed above with reference to FIG. 1, the switching between the modes can be based on the envelope tracking parameters $v_T$ 111 and $V_T$ 112. The operation and various possible implementations of the VCU 207 are the same as those discussed herein above with respect to the VCU 110.

It should be noted that the utilization of a second power source 204 having an output voltage signal higher than a voltage signal provided by a first power source 203 allows the PET 200 and, in particular, the TV 208 to react faster to changes in $v_T$ 111. This accelerated reaction is of particular importance for high bandwidth signals that encounter rapid envelope changes.

The PET 200 can be configured to operate using a single power source by setting $V_{S2}$ to be equal to $V_{S1}$. It should be empathized that in both PET circuits 100 and 200 there are two separate paths for the drain current of the power amplifier during the tracking mode. In the first path, the drain current through a DV (e.g., the DV 107 or the DV 205) supplies the exact amount of the current to the power amplifier as in the normal mode during the tracking mode. In the second path, the current that flows through a TV (e.g., the TV 105 or the TV 208) is proportional to the changes in the envelope above the current diversion threshold.

The first and the second paths are part of a supplementary supply path including the DV and the TV connected in parallel between a power source and a junction node. Other paths included in the disclosed PET circuit are a main supply path and a grounding current path. The main path connects the power amplifier to a power source through the MV. The grounding current path includes the grounding valve connected between the junction node and a ground.

Therefore, it should be appreciated that the design of the PET circuits 100 and 200 allows for smooth switching between the two modes, which is crucial in high bandwidth signals where the frequency of the switching between modes is high. This smooth switching is enabled, in part, due to the fact that the storage capacitor $C_T$ (e.g., the storage capacitor $C_T$ 104 as described with respect to FIG. 1 and the storage capacitor $C_T$ 209 as described with respect to FIG. 2) is charged to a voltage level equal to the power supply $V_{S1}$ when in the normal mode.

Figure 3:
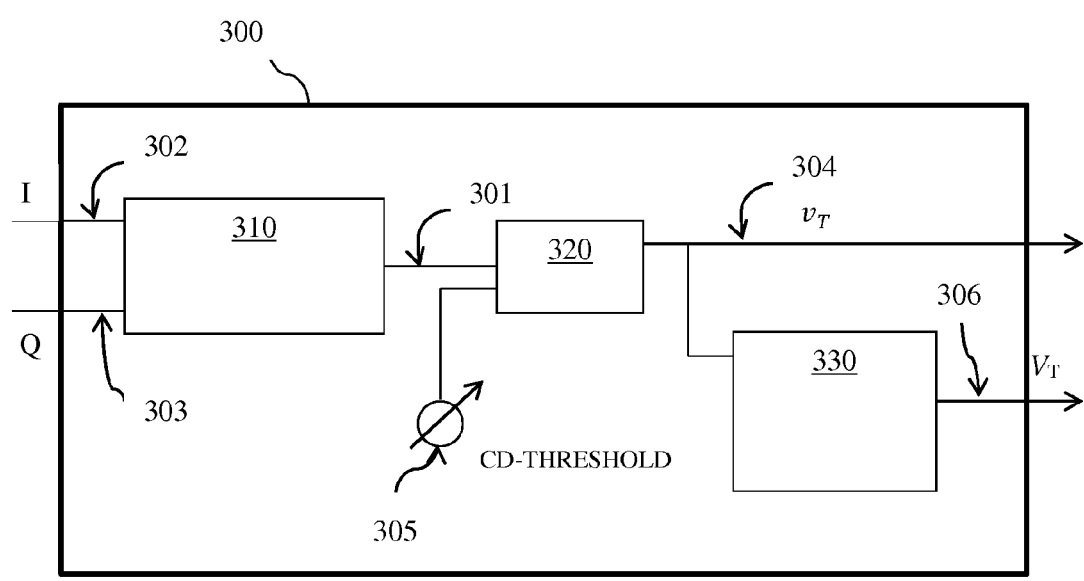
FIG. 3 is a block diagram of a unit for generating envelope tracking parameters according to one embodiment

FIG. 3 shows an exemplary and non-limiting block diagram of a unit 300 for generating envelope tracking parameters $v_T$ and $V_T$ according to one embodiment. The unit 300 may be part of a baseband module connected to a PET circuit (e.g., the PET circuit 100 or the PET circuit 200). In the embodiment disclosed herein, the envelope tracking parameters $v_T$ and $V_T$ are generated from In-phase (I) and Quadrature (Q) components of a transmitted signal.

The unit 300 includes an envelope generation block 310, a maximum function block 320, and a hard limiter block 330. The envelope generation block 310 computes the instantaneous envelope 'e' 301 by determining the root of the sum of the squares I and Q components 302 and 303, respectively. That is:

$$e = \sqrt{I^2 + Q^2}$$

The envelope tracking parameter $v_T$ 304 is an analog signal generated by finding the maximum between the instantaneous envelope 'e' 301 and a Current Diversion threshold (CD-threshold) 305. In an embodiment, the CD-threshold 305 is set respective of the highest peak of the type of respective signal being transmitted (e.g., LTE, Wi-Fi, and so on). For example, the CD-threshold may be between 60% and 70% of the peak level of the signals. The CD-threshold 305 is an input to the maximum function block 320. In one embodiment, the values of the parameter $v_T$ 304 are set by the maximum function block 320 as follows:

$v_T$=e−CD-threshold when e ≥ CD-threshold
$v_T$=0 when e<CD-threshold

The hard limiter block 330 generates the envelope tracking parameter $V_T$ 306 as a function of the analog signal $v_T$ 304. As noted above, the envelope tracking parameter $V_T$ 306 is a binary parameter. In an embodiment, the hard limiter block 330 generates the following values for the envelope tracking parameter $V_T$:

$V_T$=0 when $v_T$=0
$V_T$=1 when $v_T$>0

Figure 4:
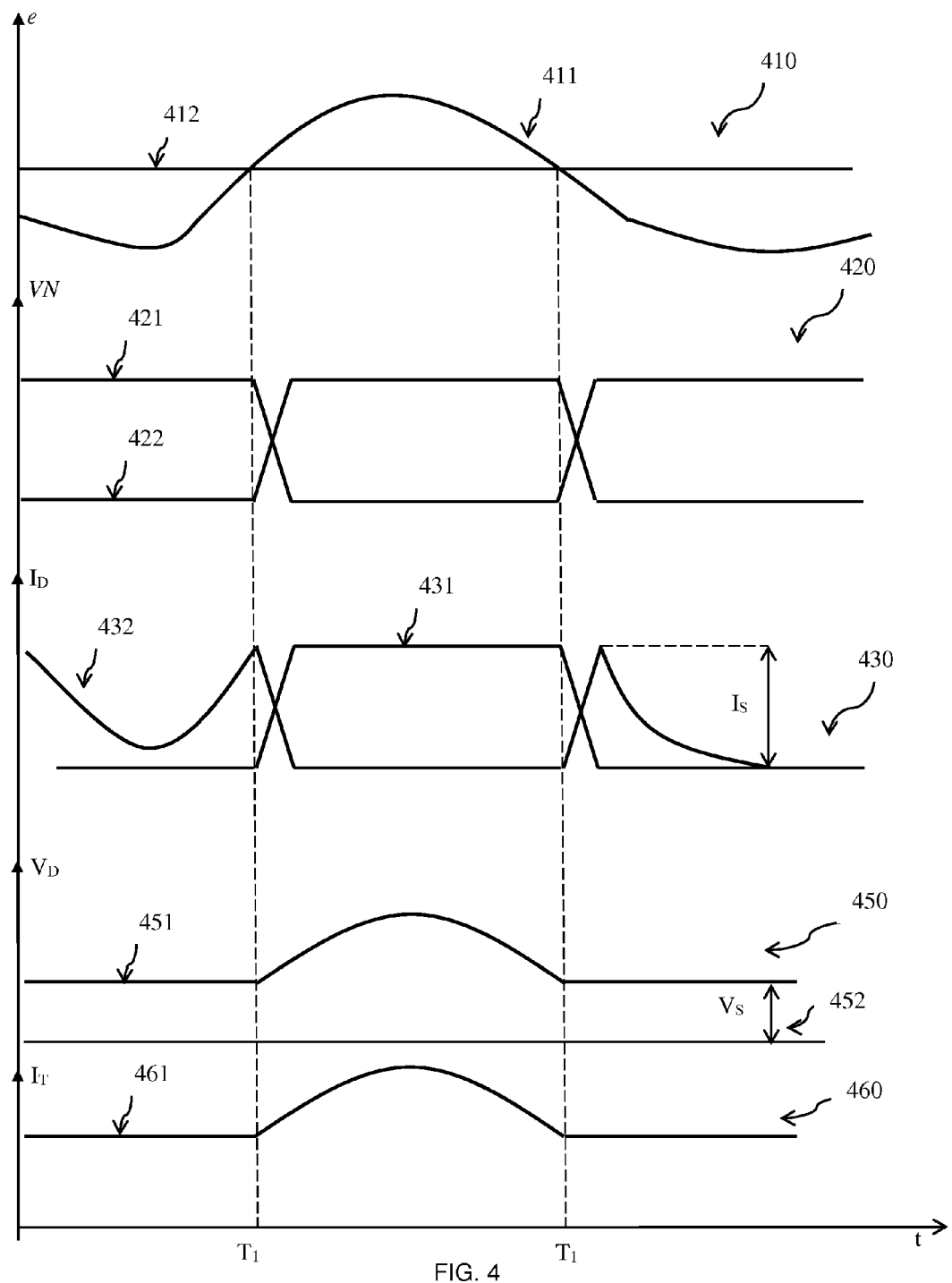
FIG. 4 shows various waveforms demonstrating the operation of the disclosed PET circuit.

FIG. 4 illustrates the various signals illustrating the operation of the PET circuit 100 according to one embodiment. FIG. 4 shows graphs 410 through 460. The graph 410 is an example of an instantaneous envelope 'e' 411 of a transmitted signal with respect to a current diversion threshold 412. The graph 420 shows the transitions between the normal mode VN 421 and the tracking mode $\overline{VN}$ 422. The graph 430 illustrates the diversion current $I_D$ 431 as compared to a power amplifier drain input 432.

The graphs 450 and 460 illustrate the voltage signal $V_D$ 451 and a tracking current signal $I_T$ 461, respectively. The voltage $V_D$ is the drain voltage of the power amplifier.

As noted above, when the envelope 411 is below the current diversion threshold 412, the PET circuit 100 is in its normal mode and, thus, the value of the normal mode VN 421 is high and the value of tracking mode $\overline{VN}$ 422 is low (see graph 420). The current into the power amplifier's drain input in this case is $I_M$-$I_{GV}$ (see signal 432) and the diversion current $I_D$=0 (see signal 431). As illustrated in graphs 450 and 460, the tracking current signal $I_T$ 461 is zero while the drain voltage $V_D$ 451 equals the supply voltage $V_S$ 452.

Referring again to graph 410, when the envelope 411 of the transmitted signal crosses the current diversion threshold 412 (e.g., at time $T_1$), the PET circuit 100 switches to the tracking mode. In the tracking mode, the VN 421 transitions to a low level signal and the $\overline{VN}$ 422 transitions to a high value signal (as seen in graph 420). The current flow to the power amplifier's drain is the sum of the drain current signal $I_D$ 431 and the tracking current signal $I_T$ 461. As both the MV and the GV are blocked and, consequently, the current signals $I_M$ and $I_{GV}$, the drain current signal $I_D$ 431 reaches its nominal value $I_S$ 433 and the current signal $I_T$ 461 follows the envelope of the transmitted signal.

When the envelope 411 of the transmitted signal falls again below the current diversion threshold 412 (e.g., at time $T_2$), the signals are set to their respective values as of immediately prior to switching to tracking mode.

Figure 5:
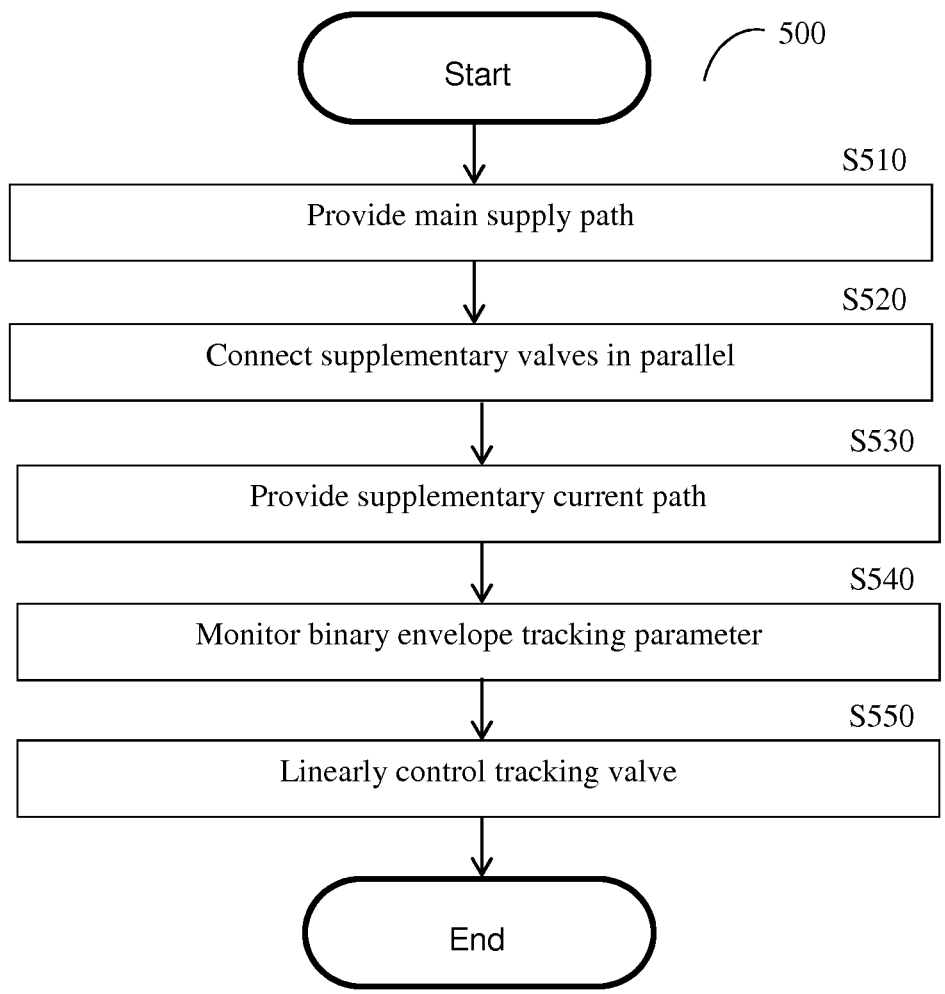
FIG. 5 is a flowchart illustrating a method for performing partial envelope tracking according to one embodiment.

FIG. 5 shows an exemplary and non-limiting flowchart 500 illustrating a method for performing partial envelope tracking according to one embodiment. The disclosed method allows for providing a dynamic voltage range to a power amplifier. The voltage range can increase to up to twice a voltage signal provided by the power supply voltage in order to linearly amplify an RF input signal having fluctuating amplitude. In an embodiment, the method involves tracking the envelope of the input RF signal at values above the nominal value for which the power supply's voltage is still sufficient.

At S510, a main supply path connecting the power amplifier to a first power source is provided. The amplifier and the first power source are connected through a main valve (MV). In an embodiment, the MV is set to conduct only when the envelope of the input RF signal is below a certain nominal value, and is blocked (open circuited) otherwise.

At S520, a supplementary supply path including two supplementary valves is connected in parallel between a second power source and a junction node. In an embodiment, the first and second power sources are the same power source or are both incorporated in a single power source. The junction node provides a connection point to a storage capacitor, which is further connected to the power amplifier at the same point where main valve (MV) is connected.

According to an exemplary embodiment, one of the supplementary valves is set as a diversion valve (DV), while the other is set as a tracking valve (TV). The diversion valve conducts when the main valve is blocked, and is set to conduct exactly the current that is being blocked in the main valve when the envelope reaches said nominal value. The tracking valve is linearly controlled by circuitry driven by the signal's envelope, such as to allow the flow of the necessary additional current that is required to increase the power amplifier's drain voltage (and, thus, track the signal's envelope).

At S530, a supplementary current path is provided through a grounding valve (GV). The grounding valve is connected between the junction node and ground and is set to conduct when the main valve is also set to conduction. In an embodiment, the various valves are field-effect transistors (FETs).

At S540, a binary envelope tracking parameter is monitored to determine an appropriate mode of operation. Specifically, the binary envelope tracking parameter is monitored to determine whether to switch the main, diversion, and ground valves into their conductance or blocked states. As discussed in detail above, the switching is set to occur when the envelope of the input RF signal crosses a nominal value (i.e., the current division threshold). In an embodiment, during the time period when the envelope is higher than the nominal value, the various valves are controlled by pulse signals. The pulse signals occur for a duration which is essentially similar to the time period when the envelope is higher than the nominal value.

At S550, the tracking valve is linearly controlled by a linear feedback amplifier. The linear control ensures that the voltage fed back from the junction node is equal to the voltage that corresponds linearly to the instantaneous increase in the envelope above the nominal value.

The various embodiments disclosed herein can be implemented as hardware, firmware, software or any combination thereof. Moreover, the software is preferably implemented as an application program tangibly embodied on a program storage unit, a non-transitory computer readable medium, or a non-transitory machine-readable storage medium that can be in a form of a digital circuit, an analog circuit, a magnetic medium, or combination thereof. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

While the disclosed embodiments been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A partial envelope tracking (PET) circuit for improving the dynamic range of a power amplifier amplifying high bandwidth signals, comprising:
    a main supply path having a main valve (MV) connecting the power amplifier to a first power source;
    a storage capacitor connecting a junction node and the power amplifier;
    a supplementary supply path including a diversion valve (DV) and a tracking valve (TV), each of the diversion valve and the tracking valve connecting, in parallel between a second power source and the junction node;
    a supplementary current path including a grounding valve (GV) connecting the junction node and a ground; and
    a valves control unit (VCU) configured to monitor an envelope tracking parameter to determine an operation mode of the circuit and a state of each of the main valve, the grounding valve, the diversion valve, and the tracking valve during each respective mode of operation, wherein the operation mode is any one of: a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through the diversion valve and the storage capacitor and, thereby enabling smooth transitions between the normal mode and the tracking mode.

2. The circuit of claim 1, wherein the valves control unit is further configured to generate first and second binary diversion control signals respective of the envelope tracking parameter, wherein logic values of the first and second binary diversion control signals are opposite to each other, wherein the envelope tracking parameter is a function of an envelope of a high bandwidth signal to be amplified and a predefined threshold.

3. The circuit of claim 2, wherein the circuit operates in the normal mode when the envelope is below the predefined threshold, and wherein the circuit operates in the tracking mode when the envelope is greater than or equal to the predefined threshold.

4. The circuit of claim 2, wherein the first binary diversion control signal is set to a high logic value and the second binary diversion control signal is set to a low logic value in the normal mode, wherein the first binary diversion control signal is set to a low logic value and the second binary diversion control signal is set to a high logic value in the tracking mode.

5. The circuit of claim 2, wherein the valves control unit generates, during the normal mode, logic values of first and second binary diversion control signals that configure the main valve and the grounding valve to conduct, wherein the logic values further configure the diversion valve and the tracking valve to block, thereby causing the source of the drain current to the power amplifier to act as the first power supply.

6. The circuit of claim 2, wherein the valves control unit generates, during the tracking mode, logic values of first and second binary diversion control signals that configure the main valve and the grounding valve to block, wherein the logic values further configure the diversion valve to conduct, thereby causing the source of the drain current to the power amplifier to act as the second power source and as the tracking valve.

7. The circuit of claim 6, wherein a current flow through the tracking valve is proportional to changes in the envelope.

8. The circuit of claim 6, wherein a current from the second power source flows through the diversion valve.

9. The circuit of claim 7, wherein, at the immediate transition from the normal mode, the source of the drain current of the power amplifier is the storage capacitor and the current through the diversion valve.

10. The circuit of claim 1, wherein the first power source and the second power source are independent of each other.

11. The circuit of claim 10, wherein the second power source outputs a voltage signal higher than a voltage signal outputted by the first power source.

12. The circuit of claim 11, wherein the high bandwidth signal is at least 50 Mbps.

13. The circuit of claim 1, wherein the circuit is integrated in a wireless computing device.

14. A partial envelope tracking (PET) circuit for improving the dynamic range of a power amplifier amplifying high bandwidth signals, comprising:
    a main supply path having a main valve (MV) connecting the power amplifier to a power source;
    a storage capacitor connecting a junction node and the power amplifier;
    a supplementary supply path including a diversion valve (DV) and a tracking valve (TV) , each of the diversion valve and the tracking valve connecting, in parallel, between the power source and the junction node;
    a supplementary current path including a grounding valve (GV) connecting the junction node and a ground; and
    a valves control unit (VCU) configured to monitor an envelope tracking parameter to determine an operation mode of the circuit and a state of each of the main valve, the ground valve, the diversion valve, and tracking valve during each respective mode of operation, wherein the mode of operation is any one of: a tracking mode and a normal mode, wherein during the normal mode the storage capacitor is charged at the voltage level provided by the power source and during the tracking mode the storage capacitor is discharged, when the PET circuit switches from the normal mode to the tracking mode, a source of a drain current to the power amplifier transitions from the power source to a current path through the diversion valve and the storage capacitor and, thereby enabling smooth transitions between the normal mode and the tracking mode.

15. The circuit of claim 14, wherein the valves control unit is further configured to generate first and second binary diversion control signals respective of the envelope tracking parameter, wherein logic values of the first and second binary diversion control signals are opposite to each other, wherein the envelope tracking parameter is a function of an envelope of a high bandwidth signal to be amplified and a predefined threshold.

16. The circuit of claim 14, wherein the valves control unit generates, during the normal mode, logic values of first and second binary diversion control signals that configure the main valve and the grounding valve to conduct, wherein the logic values further configure the diversion valve and the tracking valve to block, thereby the source of the drain current to the power amplifier is the power supply.

17. The circuit of claim 16, wherein the valves control unit generates, during the tracking mode, logic values of first and second binary diversion control signals that configure the main valve and the grounding valve to block, wherein the logic values further configure the diversion valve to conduct, thereby the source of the drain current to the power amplifier is the second power source and the tracking valve.

18. The circuit of claim 17, wherein a current flow through the tracking valve is proportional to changes in the envelope.

19. The circuit of claim 17, wherein at the immediate transition from the normal mode the source of the drain current of the power amplifier is the storage capacitor and the current through the diversion valve.

20. The circuit of claim 14, wherein the high bandwidth signal is at least 50 Mbps.

21. The circuit of claim 14, wherein the circuit is integrated in a wireless computing device.

22. A wireless computing device, comprising:
a radio frequency transmitter configured to transmit high bandwidth signals, wherein the radio frequency transmitter includes at least a power amplifier;
a partial envelope tracking (PET) circuit configured to improve a dynamic range of the power amplifier, including:
a main supply path having a main valve connecting the power amplifier to a power source;
a storage capacitor connecting a junction node and the power amplifier;
a supplementary supply path including a diversion valve (DV) and a tracking valve (TV), each of the diversion valve and the tracking valve connecting in parallel between the power source and the junction node;
a current path including a grounding valve (GV) connecting the junction node and a ground; and
a valves control unit (VCU) configured to monitor an envelope tracking parameter to determine an operation mode of the circuit and a state of each of the main valve, the grounding valve, the diversion valve, and the tracking valve during each respective mode of operation, wherein the operation mode is any one of a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through the diversion valve and the storage capacitor , thereby enabling smooth transitions between the normal mode and the tracking mode.

23. The wireless computing device of claim 22, wherein the valves control unit is further configured to generate first and second binary diversion control signals respective of the envelope tracking parameter, wherein logic values of the first and second binary diversion control signals are opposite to each other, wherein the envelope tracking parameter is a function of an envelope of a high bandwidth signal to be amplified and a predefined threshold.

24. The wireless computing device of claim 22, wherein the valves control unit generates logic values of first and second binary diversion control signals that configure the main valve and the grounding valve to conduct during the normal mode, wherein the logic values further configure the diversion valve and the tracking valve to block, thereby the source of the drain current to the power amplifier is the first power supply.

25. The wireless computing device of claim 22, wherein the valves control unit generates logic values of first and second binary diversion control signals that configure the main valve and the grounding valve to block during the tracking mode, wherein the logic values further configure the diversion valve to conduct, thereby the source of the drain current to the power amplifier is the second power source and the tracking valve.

26. The wireless computing device of claim 25, wherein a current flow through the tracking valve is proportional to changes in the envelope.

27. The wireless computing device of claim 25, wherein, at the immediate transition from the normal mode, the source of the drain current of the power amplifier is the storage capacitor and the current through the diversion valve.

28. The wireless computing device of claim 22, wherein the first and second power sources are any one of: independent of each other, and the same.

29. A method for improving the dynamic range of a power amplifier amplifying high bandwidth signals, comprising:
providing a main supply path by coupling the power amplifier to a first power source through a main valve (MV);
providing a storage capacitor by coupling between a junction node and the power amplifier;
providing a supplementary supply path including a diversion valve (DV) and a tracking valve (TV) connected in parallel between a second power source and to the junction node;
providing a current path including a grounding valve (GV) by coupling between the junction node and a ground; and
monitoring an envelope tracking parameter to determine an operation mode of the circuit and a state of each of the main valve, the grounding valve, the diversion valve, and the tracking valve during each respective mode of operation, wherein the operation mode is any one of a tracking mode and a normal mode, wherein during the normal mode the storage capacitor is charged to a voltage level provided by the first power source and during the tracking mode the storage capacitor is discharged, when the PET circuit switches from the normal mode to the tracking mode, a source of a drain current to the power amplifier transitions from the first power source to a current path through the diversion valve and the storage capacitor , thereby enabling smooth transitions between the normal mode and the tracking mode.

30. The method of claim 29, wherein the first and second power sources are any one of: independent of each other, and the same.

* * * * *